United States Patent [19]

Van De Plassche

[11] Patent Number: 4,654,635
[45] Date of Patent: Mar. 31, 1987

[54] A/D CONVERTER WITH INTEGRATOR TO ENHANCE RESOLUTION

[75] Inventor: Rudy J. Van De Plassche, Sunnyvale, Calif.

[73] Assignee: U.S. Philips Corporation, New York, N.Y.

[21] Appl. No.: 772,791

[22] Filed: Sep. 5, 1985

[30] Foreign Application Priority Data

Sep. 11, 1984 [NL] Netherlands .......................... 8402766

[51] Int. Cl.$^4$ .......................... H03M 1/38; H03M 1/14
[52] U.S. Cl. ........................... 340/347 AD; 324/99 D; 340/347 M; 340/347 NT
[58] Field of Search .... 340/347 AD, 347 C, 347 NT, 340/347 M, 347 DA, 347 CC; 324/99 D

[56] References Cited

U.S. PATENT DOCUMENTS 3,603,970 9/1971 Bailey et al. ................. 340/347 AD
4,320,390 3/1982 Scott ............................. 340/347 NT
4,460,891 7/1984 Bernstein ..................... 340/347 AD
4,485,372 11/1984 Holloway .................. 340/347 M X

OTHER PUBLICATIONS

The Engineering Staff of Analog Devices, Inc., Analog–Digital Conversion Handbook, 6/1972, pp. I-54 to 59, II-48 to 51.

Primary Examiner—T. J. Sloyan
Attorney, Agent, or Firm—Robert T. Mayer; Bernard Franzblau

[57] ABSTRACT

By means of a controlled integrator, a noise component in the residual signal which is left after a conversion cycle of an analogue-to-digital converter can be eliminated for the major part. It is then possible to digitize this residual signal and thus to obtain additional bit information, as a result of which the range and the resolving power of the analogue-to-digital converter are increased.

6 Claims, 2 Drawing Figures

A/D CONVERTER WITH INTEGRATOR TO ENHANCE RESOLUTION

This invention relates to an analog-to-digital converter. More particularly, it relates to an improvement in an analogue-to-digital converter circuit comprising a first analogue-to-digital converter having a comparison circuit provided with a first input for an analogue signal to be converted and a second input for an analogue reference signal originating from a first digital-to-analogue converter connected to an output of the comparison circuit and supplying a first digital signal. An amplifier is also connected to the said output. A first switch receives a control signal after a conversion cycle of the first analogue-to-digital converter and then passes an output signal of the amplifier to a measurement circuit comprising a second analogue-to-digital converter which supplies a second supplementary digital signal, as a result of which the accuracy of the converter circuit is increased.

Such an analogue-to-digital converter circuit is known from U.S. Pat. No. 3,603,970.

In order to increase the range and the resolving power of these converter circuits, it is suggested that the residual voltage, which is left after a conversion cycle and which is mostly smaller than the value of the least significant bit, is digitized in another analogue-to-digital converter. The digital value obtained can be used to correct any errors larger than 1 L.S.B. (least significant bit) and to increase the measuring accuracy.

It will be appreciated that these known measures can be used until a physical lower limit is reached, which in this case is determined by the value of the noise signal. This signal will have to be smaller than the value of the smallest bit in the second analogue-to-digital converter.

According of the invention, measures are suggested to digitize a residual signal of a first analogue-to-digital converter, which has a substantial noise component, so that the influence of the noise is substantially completely eliminated.

For this purpose, an analogue-to-digital converter circuit of the type mentioned in the opening paragraph is characterized in that the measurement circuit includes an integrator connected to the first switch, in that the second analogue-to-digital converter is connected to an output of the integrator, in that the first switch is closed during a constant period of time between two of the said conversion cycles and in that the second analogue-to-digital converter, when a given quantization level corresponding to a value which is at most equal to the value of the least significant bit of the first analogue-to-digital converter is exceeded, connects a source to the input of the integrator via a second switch in order to reset the output signal of the integrator. Further provision is made of a digital adder circuit having a first input for the first digital signal, a second input for the second digital signal and an output supplying the desired digital signal.

It is then advantageous that the range of the converter circuit can be extended into the noise. As compared with the known circuit, a few additional bits are obtained due to the noise filter method used.

In advantageous embodiments, the second analogue-to-digital converter may be a threshold value detector which has a threshold value equal to the said quantization level corresponding to the least significant bit of the first analogue-to-digital converter and which, when this level is exceeded by the output signal of the integrator, gives off a -1- signal as a second digital signal, which signal keeps the second switch closed during a constant period of time, the said source supplying current, while the first digital signal is varied by one least significant bit. It is then achieved by simple means that an accurate least significant bit is present.

The second analogue-to-digital converter may also be of the parallel type (flash encoder) having a gate circuit connected to the digital outputs of the second analogue-to-digital converter. The gate circuit determines the quantization level and produces a signal when this level is exceeded, for closing the second switch during a constant period of time, the said source supplying current.

A very rapid conversion of the second digital signal can thus be obtained, while an embodiment can further be characterized in that the said source is a second digital-to-analogue converter whose inputs are connected to the second digital signal.

The invention will be described more fully with reference to the drawing. In the drawing.

Figure 1:
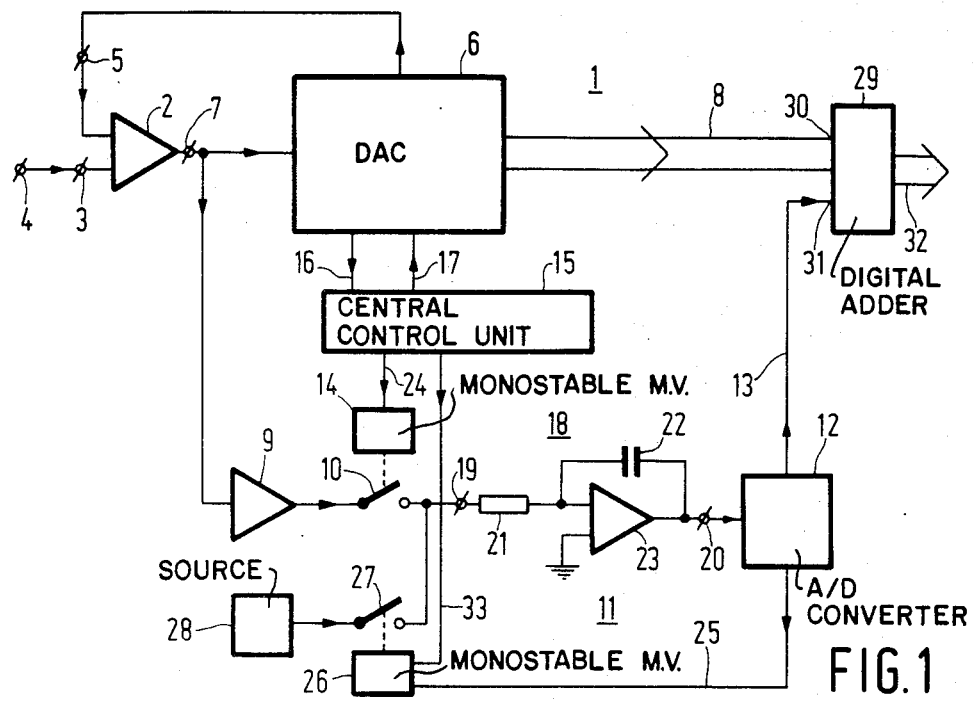
FIG. 1 shows a block circuit diagram.

In FIG. 1, a first analogue-to-digital converter 1 is provided with a comparison circuit 2 having a first input 3 for an analogue signal to be converted and to be supplied to an input 4. A second input 5 of the comparison circuit receives an analogue reference signal originating from a digital-to-analogue converter 6 which is connected to an output 7 of the comparison circuit 2 and which also supplies a first digital signal 8. An amplifier 9 is also connected to the output 7 and serves to amplify the residual signal, which is normally smaller than the value of the least significant bit of the analogue-to-digital converter 1, after termination of a conversion cycle and to pass it via a switch 10, then closed, on to a measurement circuit 11 comprising a second analogue-to-digital converter 12 which supplies a second digital signal 13. The switch 10 is closed for a constant period of time by means of a monostable circuit 14 controlled via a line 24 by a central control unit 15 which also is connected by control lines 16 and 17 to the digital-to-analogue converter 6. The measurement circuit 11 includes an integrator 18 which is connected by an input 19 to the switch 10 and is connected by an output 20 to the analogue-to-digital converter 12. Thus, the integrator 18 accumulates the residual signals, i.e. the differences between the actual analog signal at input terminal 4 and the reconstructed values of the analog signal received at terminal 5 of comparator 2 from the D/A converter 6. This is done generally over several converter cycles until the output of the integrator reaches a certain predetermined level, e.g. one LSB of the successive approximation A/D apparatus. The integrator 18 is composed of a resistor 21, a capacitor 22 and an amplifier 23. The analogue-to-digital converter 12 further measures whether the signal at the output 20 exceeds a given level. This level may be equal to the value of the least significant bit of the analogue-to-digital converter 1 integrated during the constant period of time of the circuit 14. If this level is exceeded, the analogue-to-digital converter 12 supplies a signal on the line 25 which starts a monostable circuit 26, which closes for a constant period of time a second switch 27 so that a source 28 is connected to the input 19 of the integrator 18.

After the time period has elapsed, the output signal at the output 20 has been reset with the said level.

Therefore, the circuit is operative so that the conversion result of the successive approximation A/D converter is adjusted only in the cycle in which the predetermined level is reached. The adjustment adds one LSB to the digital output. Simultaneously, the integrator output is decreased by a value corresponding to one LSB, i.e. the integrator is reset by the source 28. This achieves a smoothing effect in that the accumulated (quantized) noise is averaged over a number of samples (e.g. 10 samples provides an overall improvement in performance of effectively 1/10 LSB).

For combining the two digital signals 8 and 13, a digital adder circuit 29 is provided having a first input 30 for the first digital signal 8, a second input 31 for the second digital signal 13 and an output 32 supplying the digital conversion signal of the analogue signal at the input 4. The circuit 26 is further connected through a control line 33 to the unit 15. This unit 15 may further supply other time-dependent control signals for the various units of the converter circuit.

Figure 2:
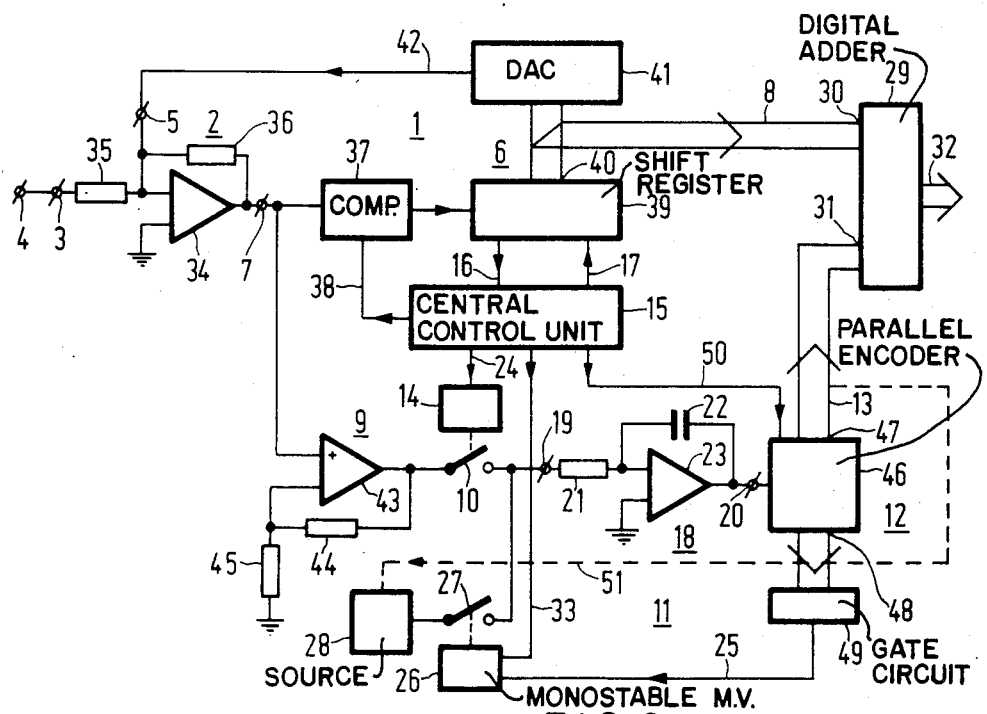
FIG. 2 shows a further elaboration of a circuit diagram of the converter circuit according to the invention.

In FIG. 2, a few of the blocks shown in FIG. 1 are further elaborated. The first analogue-to-digital converter 1 is of the successive approximation type. The comparison circuit 2 comprises an operational amplifier 34 having an input resistor 35 and a feedback resistor 36. The analogue-to-digital conversion part comprises a comparator 37 which is controlled from the unit 15 via a line 38 and controls a shift register 39. The shift register supplies digital output information from an output 40 to a digital-to-analogue converter 41 which is connected through a line 42 to the input 5. The digital information obtained at the output 40 after the termination of a conversion cycle further provides the first digital signal 8.

The amplifier 9 is composed of an operational amplifier 43 having feedback resistors 44 and 45. The second analogue-to-digital converter 12 comprises a parallel encoder 46 having an output 47 for the digital information 13 and an output 48 for the same information, to which a gate circuit 49 is connected which has a coding corresponding to the quantization level.

The second analogue-to-digital converter 12 can be a threshold value detector of the kind indicated in U.S. Pat. No. 3,603,970 by reference numerals 18 and 21 in FIG. 2. The input at resistor 17 in that Figure is then connected to the output 20 of the integrator 18 in FIG. 1 of this application and the line 191 in FIG. 2 of the patent is then line 13 and 25 in the said FIG. 1 herein.

The detector may also be a Schmitt trigger. The source 28 may be a digital-to-analogue converter which has digital inputs connected to the digital outputs of the converter 46, as indicated by the broken line 51. The converter 46 is controlled through a line 50 by the unit 15.

What is claimed is:

1. An analog-to-digital converter circuit comprising, a first analogue-to-digital converter comprising a comparison circuit having a first input for an analogue signal to be converted and a second input for an analogue reference signal originating from a first digital-to-analogue converter connected to an output of the comparison circuit and supplying a first digital signal, an amplifier connected to said output, a first switch which receives a control signal after a conversion cycle of the first analogue-to-digital converter and operative to pass an output signal of the amplifier to a measurement circuit comprising a second analogue-to-digital converter supplying a second supplementary digital signal thereby to increase the accuracy of the converter circuit, the measurement circuit including an integrator connected to the first switch, means connecting the second analogue-to-digital converter to an output of the integrator, the first switch being closed during a constant period of time between two of the said conversion cycles, wherein the second analogue-to-digital converter, when a given quantization level corresponding to a value which is at most equal to the value of the least significant bit of the first analogue-to-digital converter is exceeded, connects a source to the input of the integrator via a second switch thereby to reset an output signal of the integrator, and a digital adder circuit having a first input for the first digital signal, a second input for the second digital signal and an output supplying the desired digital signal.

2. An analog-to-digital converter circuit as claimed in claim 1, wherein the second analogue-to-digital converter comprises a threshold value detector which has a threshold value equal to the said quantization level corresponding to the least significant bit of the first analogue-to-digital converter and which, when said level is exceeded by the output signal of the integrator, supplies a -1- signal as a second digital signal that keeps the second switch closed for a constant period of time, the said source supplying current, while the first digital signal is varied by one least significant bit.

3. An analog-to-digital converter circuit as claimed in claim 1, wherein the second analogue-to-digital converter comprises the parallel type, and a gate circuit connected to digital outputs of the second analogue-to-digital converter, which gate circuit determines the quantization level and supplies a signal when this level is exceeded for closing the second switch for a constant period of time, said source supplying a current.

4. An analog-to-digital converter circuit as claimed in claim 1, characterized in that the said source comprises a second digital-to-analogue converter having its inputs connected to the second digital signal.

5. An analog-to-digital converter circuit as claimed in claim 2, wherein said source comprises a second digital-to-analogue converter having its inputs connected to the second digital signal.

6. An analog/digital converter comprising: a first analog/digital converter (ADC) including a comparison circuit having a first input for an analog signal, a first digital/analog converter (DAC) having input means coupled to an output of the comparison circuit and having a first output for supplying a first digital signal and a second output coupled to a second input of the comparison circuit to supply thereto an analog reference signal, an amplifier connected to said output of the comparison circuit, an integrator, a first controlled switch for coupling an output of the amplifier to an input of the integrator, means connecting an output of the integrator to an input of a second ADC which supplies a second digital signal, means for applying a control signal to the first controlled switch after a conversion cycle of the first ADC to operate said switch to couple an output signal of the amplifier to said integrator input, said first controlled switch being closed for a constant time period between two conversion cycles, a second controlled switch, the second ADC being responsive to an output signal of the integrator representing a given quantization level corresponding to a value at most equal to the value of the least significant bit of the first ADC to supply a control signal to the second controlled switch whereby the second controlled switch connects a source to the input of the integrator thereby to reset the integrator output signal, and means for combining said first and second digital signals to derive a digital signal representative of said analog signal.

* * * * *